United States Patent
Sato et al.

(10) Patent No.: US 11,539,185 B2
(45) Date of Patent: Dec. 27, 2022

(54) LASER APPARATUS

(71) Applicants: DENSO CORPORATION, Kariya (JP); TOHOKU UNIVERSITY, Sendai (JP); WASEDA UNIVERSITY, Tokyo (JP)

(72) Inventors: Masashige Sato, Kariya (JP); Taku Suzuki, Kariya (JP); Hiroshi Yasaka, Sendai (JP); Nobuhide Yokota, Sendai (JP); Tomohiro Kita, Shinjuku-ku (JP)

(73) Assignees: DENSO CORPORATION, Kariya (JP); TOHOKU UNIVERSITY, Sendai (JP); WASEDA UNIVERSITY, Tokyo (JP)

( * ) Notice: Subject to any disclaimer, the term of this patent is extended or adjusted under 35 U.S.C. 154(b) by 112 days.

(21) Appl. No.: 17/210,098

(22) Filed: Mar. 23, 2021

(65) Prior Publication Data

US 2021/0305778 A1 Sep. 30, 2021

(30) Foreign Application Priority Data

Mar. 27, 2020 (JP) .............................. JP2020-058450

(51) Int. Cl.
*H01S 5/0687* (2006.01)
*H01S 5/042* (2006.01)
*H01S 5/00* (2006.01)
*H01S 5/062* (2006.01)

(52) U.S. Cl.
CPC .......... *H01S 5/0687* (2013.01); *H01S 5/0014* (2013.01); *H01S 5/0427* (2013.01); *H01S 5/06246* (2013.01)

(58) Field of Classification Search
CPC ................................................. H01S 5/06246

USPC .......................................................... 372/32
See application file for complete search history.

(56) References Cited

U.S. PATENT DOCUMENTS

2003/0112835 A1* 6/2003 Williams ................ H01S 3/067
372/20
2007/0230524 A1* 10/2007 Li .......................... G11B 7/1263

FOREIGN PATENT DOCUMENTS

| JP | 2001-284707 A | 10/2001 |
| JP | 2012-033807 A | 2/2012 |
| JP | 2012-114163 A | 6/2012 |
| JP | 2012-256667 A | 12/2012 |

OTHER PUBLICATIONS

T. Okoshi et al., "Novel method for high resolution measurement of laser output spectrum", Electronics Letters, vol. 16, No. 16, p. 630-631, 1980 (Abstract only).
Konosuke Aoyama et al., "Strategy of optical negative feedback for narrow linewidth semiconductor lasers", Optics Express, vol. 26, No. 16, pp. 21159-21169, 2018.

* cited by examiner

*Primary Examiner* — Tuan N Nguyen
(74) *Attorney, Agent, or Firm* — Posz Law Group, PLC

(57) ABSTRACT

A laser apparatus includes: a light source configured to generate laser light; and an optical negative feedback unit configured to narrow a spectral line of the laser light using optical negative feedback. A modulation signal is input to the light source to modulate a frequency of the laser light. A modulation amount in the frequency of the laser light is detected. A modulation sensitivity is calculated from (i) the modulation amount and (ii) an intensity of the modulation signal.

14 Claims, 6 Drawing Sheets

LASER APPARATUS

CROSS REFERENCE TO RELATED APPLICATION

The present application is based on Japanese Patent Application No. 2020-058450 filed on Mar. 27, 2020, the disclosure of which is incorporated herein by reference.

TECHNICAL FIELD

The present disclosure relates to a laser apparatus using optical negative feedback.

BACKGROUND

There are proposed various methods for narrowing the spectral line (i.e., narrowing the spectral line width) of a laser apparatus. For example, in a laser apparatus having an external resonator structure in which a resonator is provided outside the light emitter, a method of narrowing the line by extending the length of the resonator has been proposed. In this method, there is little factor that the line width changes from the design value, so there is not a high need to confirm the line narrowed state. However, if the length of the resonator is extended, it becomes difficult to adjust the oscillation frequency as the line is narrowed, and the frequency modulation range becomes narrow.

In addition, there is proposed a method of narrowing the line by adjusting the frequency of the output light by electric feedback technology and canceling the fluctuation. In this method, since the fluctuation is converted into an electric signal, if it is a low noise circuit, it is possible to detect the degree of the fluctuation on the circuit and confirm the line narrowed state. However, the circuit noise limits the effect of narrowing the line.

SUMMARY

According to an example of the present disclosure, a laser apparatus is provided to include: a light source configured to generate laser light; and an optical negative feedback unit configured to narrow a spectral line of the laser light using optical negative feedback. A modulation signal is input to the light source to modulate a frequency of the laser light. A modulation amount in the frequency of the laser light is detected. A modulation sensitivity is calculated from (i) the modulation amount and (ii) an intensity of the modulation signal.

BRIEF DESCRIPTION OF DRAWINGS

The objects, features, and advantages of the present disclosure will become more apparent from the following detailed description made with reference to the accompanying drawings. In the drawings.

DETAILED DESCRIPTION

Hereinafter, embodiments of the present disclosure will be described with reference to the drawings. In the following embodiments, the same or equivalent parts are denoted by the same reference signs.

First Embodiment

The following describes a first embodiment. A laser apparatus of the present embodiment is used, for example, in LiDAR (Light Detection and Ranging), which is mounted on a vehicle and measures the distance between the vehicle and a surrounding object. Here, a case where the distance to an object is measured by the FMCW (Frequency Modulated Continuous Wave) method in LiDAR will be described.

Figure 1:
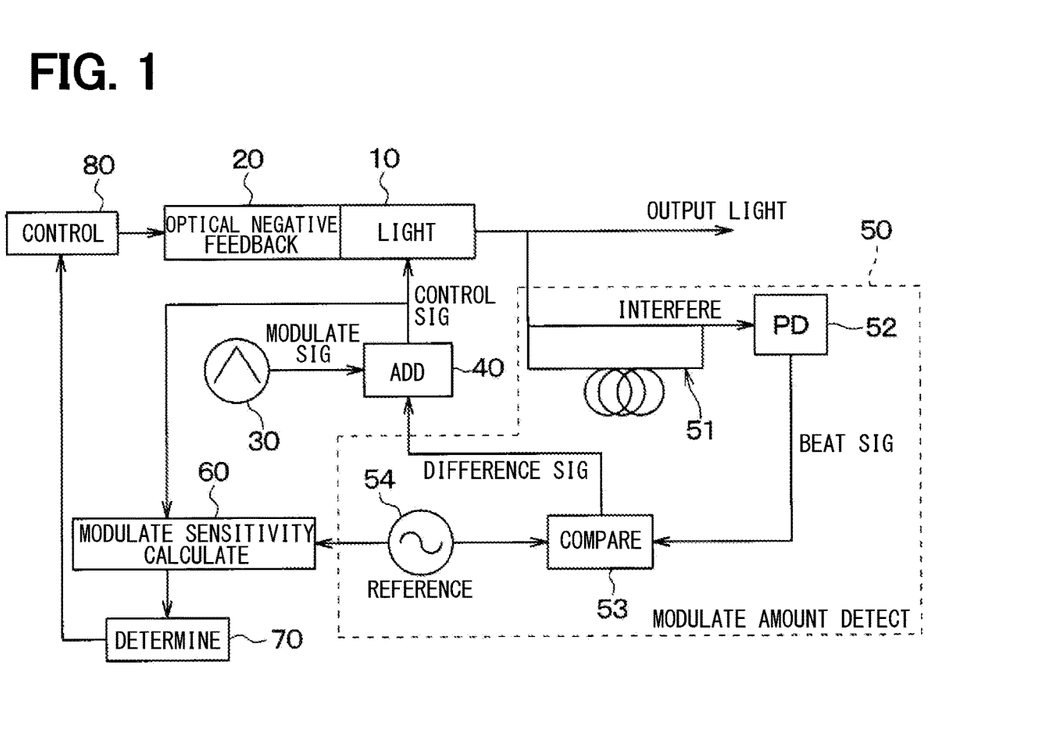
FIG. 1 is a block diagram of a laser apparatus according to a first embodiment.

As shown in FIG. 1, the laser apparatus includes constituent elements that are a light source 10, an optical negative feedback unit 20, a modulation signal generator unit 30 (which may also be referred to as a modulation signal generator 30), an adder 40, and a modulation amount detector unit 50 (which may also be referred to as a modulation amount detector 50). Note that an individual unit of the units or the like 20, 30, 40, and 50 may be provided as hardware circuitry. The optical negative feedback unit 20, the modulation signal generator unit 30, the adder 40, and the modulation amount detector unit 50 may also be referred to, respectively, as an optical negative feedback circuit 20, a modulation signal generator circuit 30, an adder circuit 40, and a modulation amount detector circuit 50. The laser apparatus is configured to be an optical integrated circuit formed on an SOI (Silicon on Insulator) substrate by silicon photonics; on the optical integrated circuit, the above constituent elements, a light waveguide and metal wiring connecting the constituent elements are formed.

The light source 10 generates a laser light (i.e., laser beam) emitted or output to the outside of the laser apparatus, and is composed of a laser diode or the like. A part of the output light of the light source 10 is inputted to the optical negative feedback unit 20. The negative feedback unit 20 reflects the light generated by the light source 10 and returns it to the light source 10, and cancels the fluctuation of the frequency of the output light of the light source 10 by the optical negative feedback, stabilizes the frequency, and narrows the spectrum (i.e., narrowing the spectral line or line width). For example, the principle of optical negative feedback is described in the following document: K. Aoyama, N. Yokota, and H. Yasaka, "Strategy of optical negative feedback for narrow linewidth semiconductor lasers", OPTICS EXPRESS, Vol. 26, No. 16, 21159 (2018).

Figure 2:
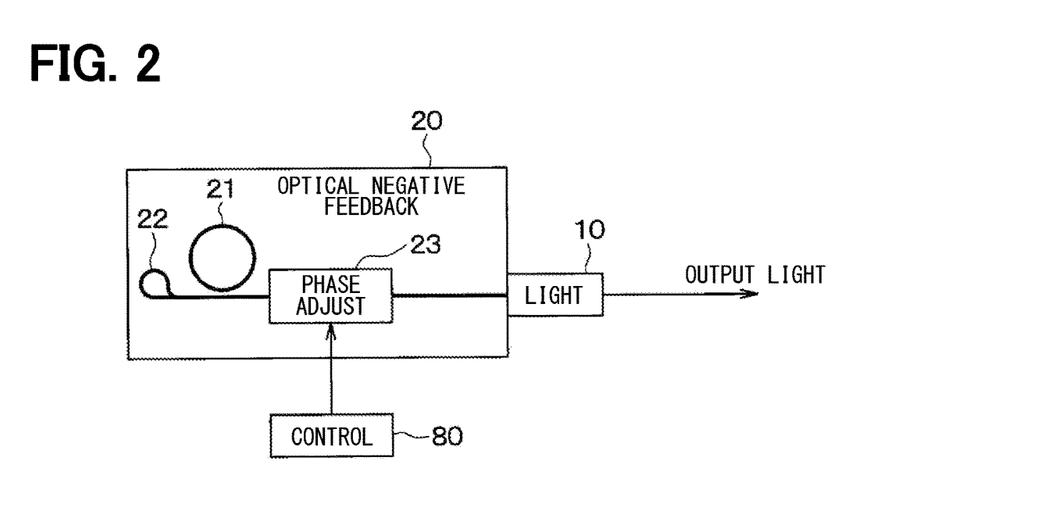
FIG. 2 is a diagram showing a configuration of an optical negative feedback unit.

In the above document, the optical negative feedback unit is composed of a Fabry-Perot etalon and a lens. On the other hand, as shown in FIG. 2, the optical negative feedback unit 20 of the present embodiment has a configuration including a ring filter 21, a loop mirror 22, and a phase adjuster unit 23. Of the output light of the light source 10, the component transmitted through the ring filter 21 is reflected by the loop mirror 22 and returned to the light source 10.

The center frequency of the ring filter 21 is adjusted to a desired frequency of the output light. When the frequency of the output light of the light source 10 is far from a desired frequency, the frequency control by the optical negative feedback works.

The phase of a return light that is returned from the loop mirror 22 is adjusted by the phase adjuster unit 23 as needed. The phase adjuster unit 23, which may also be referred to as an adjuster 23 or an adjuster circuit 23, is composed of, for example, a microheater or the like. The details of the phase adjustment by the phase adjuster unit 23 will be described later.

As shown in FIG. 1, the modulation signal from the modulation signal generator unit 30 is added to the light source 10 by the adder 40 and input to the light source 10 together with the signal from the modulation amount detector unit 50. The frequency of the output light of the light source 10 changes according to this input signal. As described above, in the present embodiment, the frequency of the output light is modulated by the modulation signal generator unit 30 and the adder 40. The modulation signal generator unit 30 and the adder 40 correspond to a frequency modulator unit, a frequency modulator circuit, or a frequency modulator.

The modulation signal of the modulation signal generator unit 30 is a triangular wave whose amplitude increases or decreases with the passage of time due to distance measurement by the FMCW method. Then, in order to detect the amount of change in the frequency of the output light according to the modulation signal of the modulation signal generator unit 30, a part of the output light is branched and input to the modulation amount detector unit 50.

The modulation amount detector unit 50 detects the modulation amount of the frequency of the output light. The modulation amount detector unit 50 includes a PLL (Phase Locked Loop) circuit including a beat signal generator unit 51, a PD (photodiode) 52, a comparator 53, and a reference signal generator unit 54. The beat signal generator unit 51 may also be referred to as a beat signal generator 51 or a beat signal generator circuit 51. The reference signal generator unit 54 may also be referred to as a reference signal generator 54 or a reference signal generator circuit 54.

The beat signal generator unit 51 includes a light waveguide in which the output light of the light source 10 propagates as it is, and a light waveguide provided with a delay circuit. A beat signal according to the modulation inclination of the frequency of the output light is obtained by the self-heterodyne of the output light of the light source 10 and the delayed output light. This signal is converted into an electric signal by the PD 52 and inputted to the comparator 53.

The beat signal outputted from the PD 52 and the reference signal outputted from the reference signal generator unit 54 are inputted to the comparator 53. The reference signal is generated so as to correspond to the inclination of the modulation signal generated by the modulation signal generator unit 30. The comparator 53 compares the reference signal with the beat signal and outputs a difference signal. The difference signal is generated so as to lower the frequency of the output light when the frequency of the beat signal is higher than the frequency of the reference signal. When the frequency of the beat signal is lower than the frequency of the reference signal, it is generated so as to increase the frequency of the output light. This difference signal corresponds to the modulation amount of the frequency. The modulation amount detector unit 50 detects the modulation amount in this way.

The modulation signal of the modulation signal generator unit 30 is added to the difference signal by the adder 40, and the signal generated by this is input to the light source 10 as a control signal. In this way, by comparing the beat signal with the reference signal and feeding back the difference to the modulation signal, linear modulation becomes possible; the frequency of the reference signal and the inclination of the control signal have a linear relationship.

The laser apparatus of the present embodiment has a configuration for determining the effect of narrowing the line by the optical negative feedback unit 20, that is, determining whether a desired line width is realized. Specifically, as shown in FIG. 1, the laser apparatus includes a modulation sensitivity calculator unit 60, a determination unit 70, and a controller unit 80. Each of the modulation sensitivity calculator unit 60, the determination unit 70, and the controller unit 80 is composed of, for example, a DSP (Digital Signal Processor). In other words, one or more DSPs (i.e., one or more processors) may be included in the laser apparatus of the present embodiment to implement each of the modulation sensitivity calculator unit 60, the determination unit 70, and the controller unit 80. Furthermore, the modulation sensitivity calculator unit 60, the determination unit 70, and the controller unit 80 may also be referred to, respectively, as the modulation sensitivity calculator circuit 60, the determination circuit 70, and the controller circuit 80.

Figure 3:
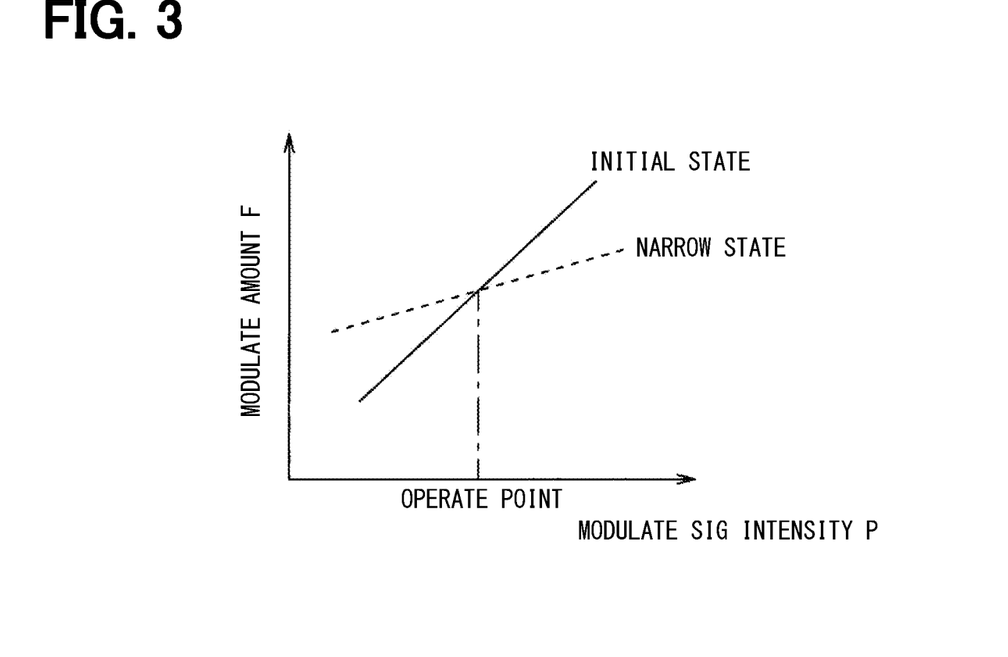
FIG. 3 is a diagram showing a relationship between a modulation signal intensity and a frequency modulation amount.

The modulation sensitivity calculator unit 60 calculates the modulation sensitivity of the output light with respect to the modulation signal generated by the modulation signal generator unit 30. In the laser apparatus including the optical negative feedback unit 20, the modulation sensitivity is inversely proportional to the line narrowing effect, as shown in FIG. 3. Here, the intensity of the modulation signal is P, and the amount of modulation of the frequency of the output light is F. In the initial state where the line is not narrowed, the change in the modulation amount F is large with respect to the change in the intensity P, and the modulation sensitivity $dF/dP$ is large. On the other hand, in the line narrowed state, the change in the modulation amount F with respect to the change in the intensity P is small, and the modulation sensitivity $dF/dP$ is small. The modulation sensitivity calculator unit 60 transmits the calculated modulation sensitivity to the determination unit 70.

The determination unit 70 determines the line narrowed state based on the modulation sensitivity calculated by the modulation sensitivity calculator unit 60. Specifically, the determination unit 70 compares the modulation sensitivity $dF/dP$ with a predetermined threshold value. When the modulation sensitivity $dF/dP$ is smaller than the threshold value, it is determined that the laser apparatus is in the line narrowed state. When the modulation sensitivity dF/dP is equal to or more than the threshold value, it is determined that the laser apparatus is not in the line narrowed state.

Figure 4:
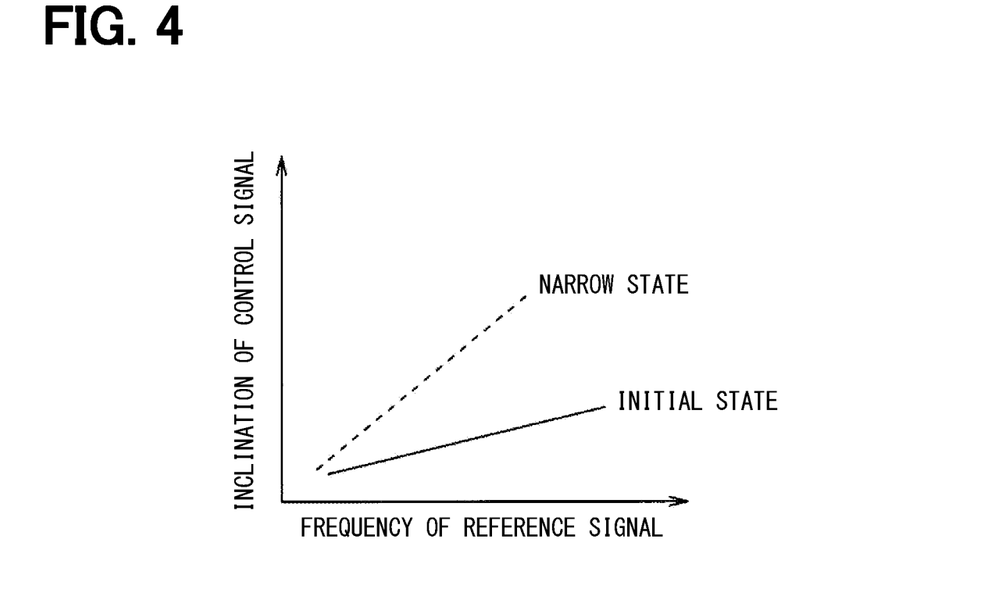
FIG. 4 is a diagram showing a relationship between a frequency of a reference signal and an inclination of a control signal.

A control signal output by the adder 40 and a reference signal output by the reference signal generator unit 54 are input to the modulation sensitivity calculator unit 60 of the present embodiment. Then, depending on the relationship between the intensity P and the modulation amount F shown in FIG. 3, the relationship between the frequency of the reference signal and the inclination or slope of the control signal becomes as shown in FIG. 4. That is, in the line narrowed state, the amount of change in the inclination of the control signal with respect to the change in the frequency of the reference signal is larger than in the initial state. The modulation sensitivity calculator unit 60 calculates the modulation sensitivity from the amount of change in the inclination of the control signal with respect to the change in the frequency of the reference signal. The determination unit 70 compares this modulation sensitivity with the threshold value to determine the line narrowed state. The determination result by the determination unit 70 is transmitted to the controller unit 80.

The controller unit 80 controls the optical negative feedback unit 20 according to the determination result by the determination unit 70. The output signal of the controller unit 80 is input to the phase adjuster unit 23. When the determination unit 70 determines that the laser apparatus is in the line narrowed state, the controller unit 80 maintains the state of the phase adjuster unit 23. On the other hand, when the determination unit 70 determines that the laser apparatus is not in the line narrowed state, the controller unit 80 controls the phase adjuster unit 23 to change the phase of the return light, thereby bringing the laser apparatus closer to the line narrowed state.

When the laser apparatus is brought closer to the line narrowed state, the controller unit 80 determines the phase state from the relationship between the modulation sensitivity and the modulation amount of the frequency, and controls the phase adjuster unit 23 according to the phase state. The coupling phase of the optical negative feedback unit 20 is controlled so that, for example, the phase difference between the return light and the light output from the light source 10 is π/2.

Figure 5:
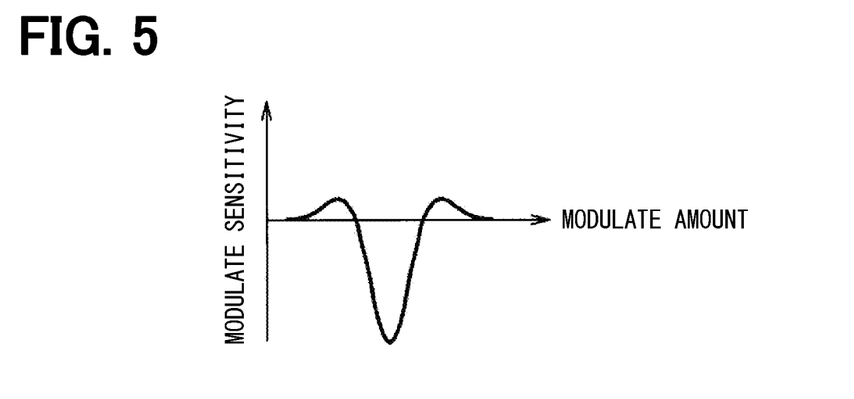
FIG. 5 is a diagram showing a relationship between a modulation amount and a modulation sensitivity when the phase state is normal.

As shown in FIG. 5, suppose a case where the graph of the modulation sensitivity with respect to the modulation amount drops at the modulation amount corresponding to the desired frequency and reaches the maximum value before and after this modulation amount. In such a case, the controller unit 80 determines that the phase state is normal, and maintains the state of the phase adjuster unit 23.

Figure 6:
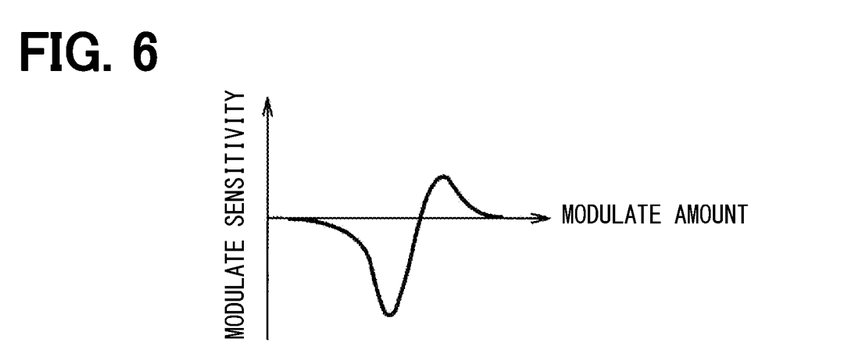
FIG. 6 is a diagram showing a relationship between a modulation amount and a modulation sensitivity when the phase of the return light is shifted in the positive direction.

As shown in FIG. 6, suppose a case where the graph of the modulation sensitivity with respect to the modulation amount drops at the modulation amount corresponding to the desired frequency and takes the maximum value only at the modulation amount larger than this modulation amount. In such a case, the controller unit 80 determines that the phase of the return light is shifted in the positive direction. Then, the controller unit 80 lengthens the effective feedback optical path by weakening the heater power of the phase adjuster unit 23, and changes the phase in the negative direction.

Figure 7:
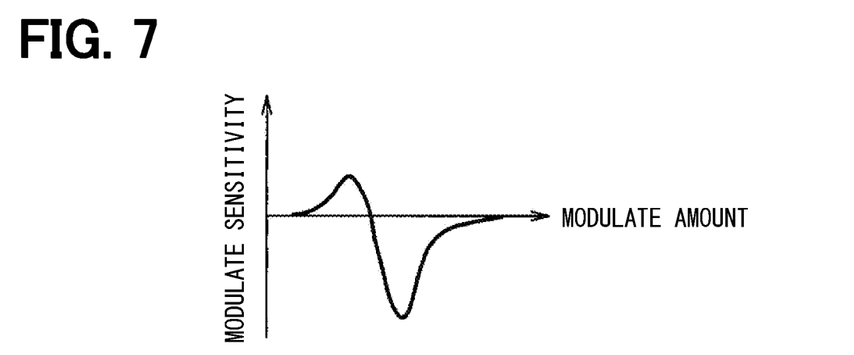
FIG. 7 is a diagram showing a relationship between a modulation amount and a modulation sensitivity when the phase of the return light is shifted in the negative direction.

As shown in FIG. 7, suppose a case where the graph of the modulation sensitivity with respect to the modulation amount drops at the modulation amount corresponding to the desired frequency and takes the maximum value only at the modulation amount smaller than this modulation amount. In such a case, the controller unit 80 determines that the phase of the return light is shifted in the negative direction. Then, the controller unit 80 shortens the effective feedback optical path by increasing the heater power of the phase adjuster unit 23, and changes the phase in the positive direction.

Further, in the optical negative feedback unit 20, the effective optical path length of the ring filter 21 is changed by a microheater (not shown). The controller unit 80 controls the frequency of light passing through the ring filter 21 by adjusting the electric power of the microheater. By controlling the phase and frequency in this way, the laser apparatus approaches the line narrowed state.

As described above, in the present embodiment, the determination unit 70 determines the line narrowing effect by utilizing the phenomenon peculiar to optical negative feedback that the modulation sensitivity is inversely proportional to the line narrowing effect. Then, the controller unit 80 performs control for optimizing the state of the optical negative feedback unit 20 based on the determination result. As a result, even when the line narrowing effect changes due to environmental factors or the like, the optical negative feedback unit 20 can be appropriately adjusted to maintain the optimum state. In addition, a large-scale and expensive measuring instrument is not required, and the line narrowing effect can be confirmed with a simple configuration.

Further, in the method described in the above document, the frequency and phase of the operating point are adjusted by directly measuring the line width. On the other hand, in the present embodiment, since it is not necessary to directly measure the line width, the laser apparatus can be made into a simpler configuration.

Second Embodiment

A second embodiment will be described. This embodiment is a modification of the configuration of the modulation amount detector unit 50 with respect to the first embodiment. Since the others are the same as those in the first embodiment, only the parts different from the first embodiment will be described.

Figure 8:
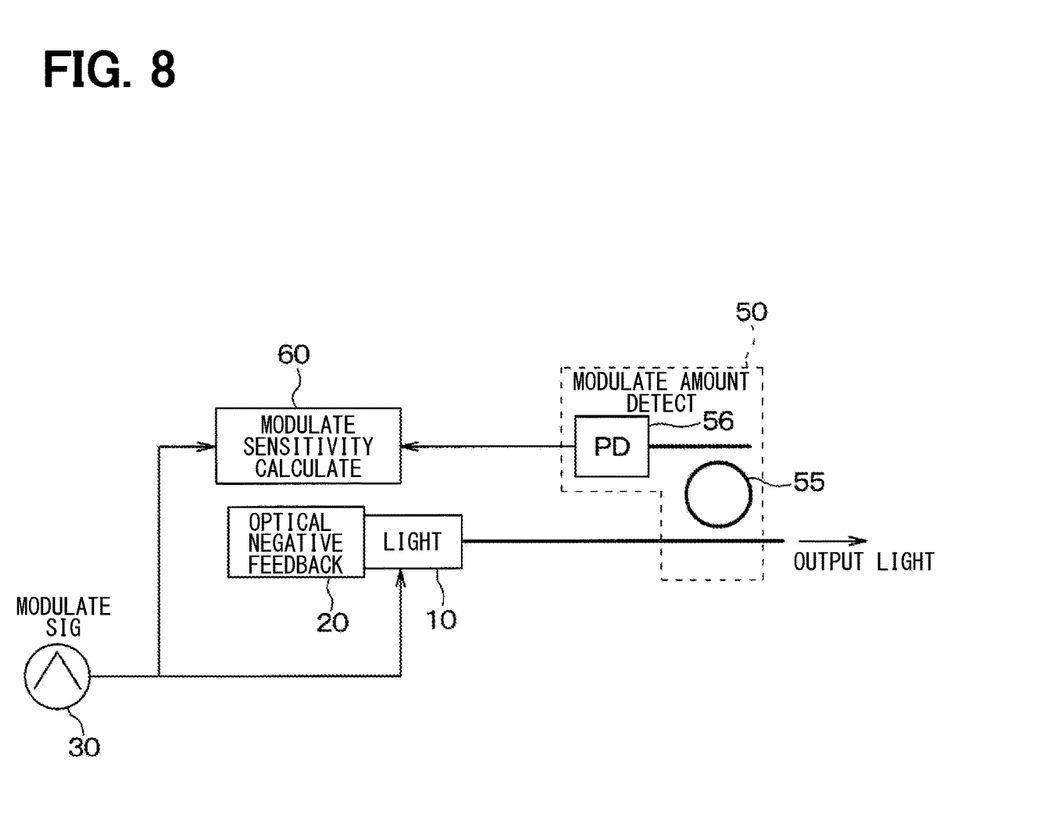
FIG. 8 is a diagram showing a configuration of a modulation amount detector unit according to a second embodiment.

As shown in FIG. 8, the modulation amount detector unit 50 of the present embodiment includes a ring filter 55 and a PD (photodiode) 56. The light transmitted through the ring filter 55 is converted into an electric signal by the PD 56 and input to the modulation sensitivity calculator unit 60. Further, the laser apparatus of the present embodiment does not include the adder 40, and the modulation signal from the modulation signal generator unit 30 is directly input to the light source 10 as a control signal. The modulation signal generator unit 30 corresponds to a frequency modulator unit, a frequency modulator circuit, or a frequency modulator. In FIG. 8, the determination unit 70 and the controller unit 80 are omitted and not shown.

The transmittance of a ring filter with a high Q value depends sensitively on frequency. Therefore, if the Q value of the ring filter 55 is set high, the change in the intensity of the transmitted light can be regarded as the change in the frequency, and the modulation amount can be detected based on the intensity of the transmitted light. Then, the modulation sensitivity can be calculated based on (i) the change in the output of the PD 56 and (ii) the modulation signal; the line narrowed state can be thus determined.

Figure 9:
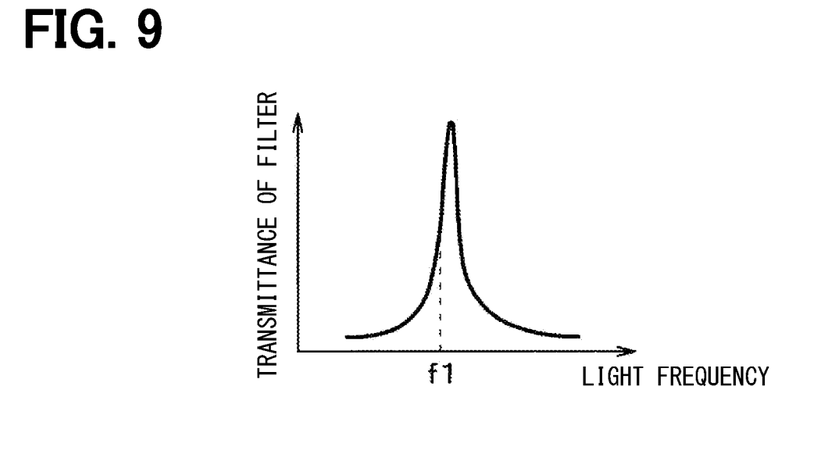
FIG. 9 is a diagram showing the characteristics of a ring filter.
Figure 10:
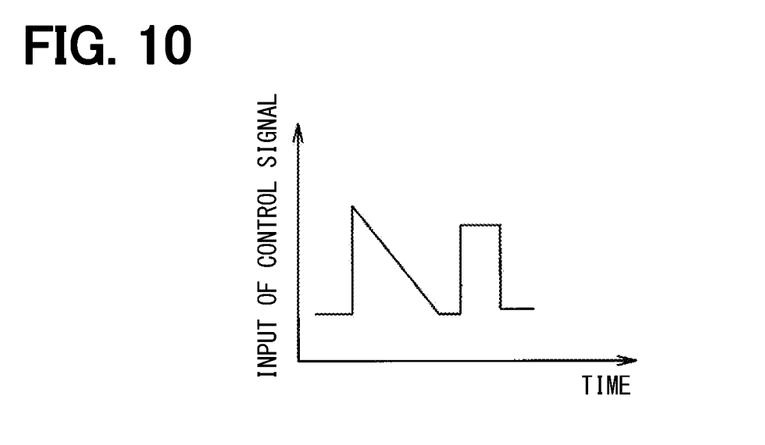
FIG. 10 is a diagram showing a control signal.
Figure 11:
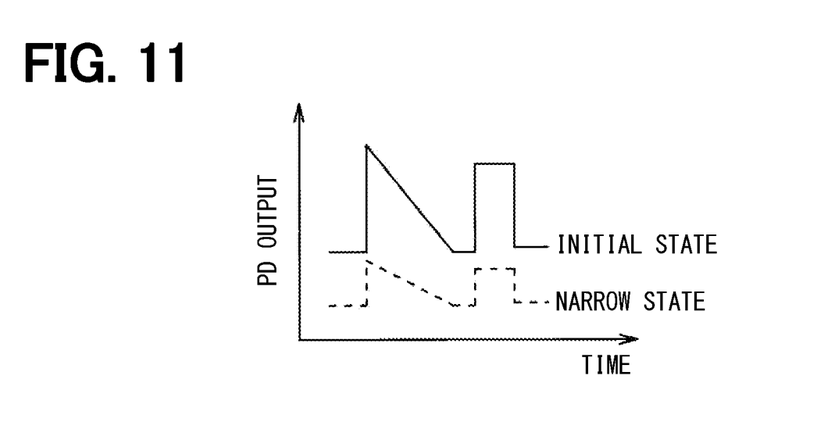
FIG. 11 is a diagram showing an output of a photodiode.

For example, the ring filter 55 has the characteristics shown in FIG. 9. When the frequency is modulated in the vicinity of the frequency f1 shown in FIG. 9, the output of the PD 56 increases or decreases in the same manner as the frequency increases or decreases. Then, when a control signal as shown in FIG. 10 is input, the output of the PD 56 greatly increases or decreases as shown by the solid line in FIG. 11 in the initial state where the line is not narrowed.

On the other hand, in the line narrowed state, the change in the frequency of the output light with respect to the change in the control signal is small. Therefore, as shown by the broken line in FIG. 11, the output of the PD 56 increases or decreases slightly as compared with the initial state. Therefore, by comparing the output of the PD 56 with the control signal, the modulation sensitivity can be calculated and the line narrowed state can be determined as in the first embodiment.

In the present embodiment in which the modulation amount detector unit 50 includes the ring filter 55 and the PD 56 in this way, the same effect as in the first embodiment can be obtained.

Third Embodiment

A third embodiment will be described. Since the present embodiment is the same as the second embodiment except that the configuration of the light source 10 is changed with respect to the second embodiment, only portions different from the second embodiment will be described.

Figure 12:
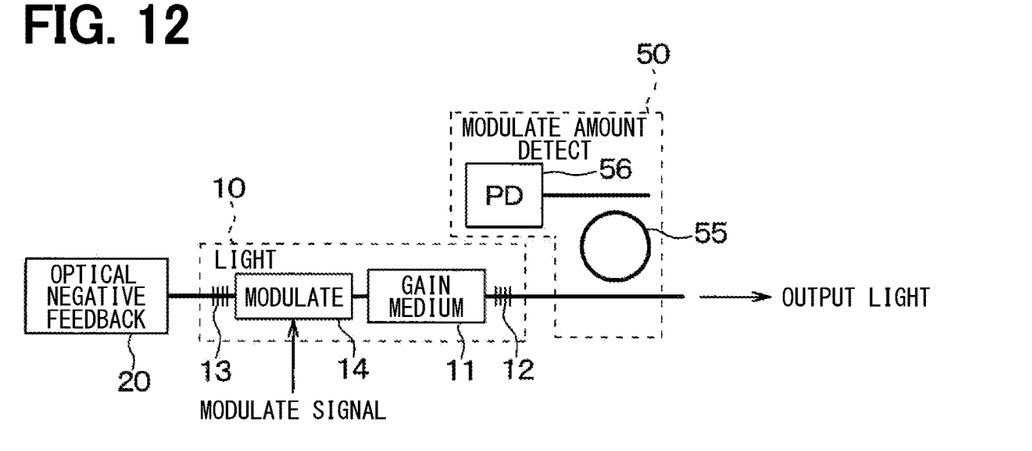
FIG. 12 is a diagram showing a configuration of a light source according to a third embodiment.

The light source 10 of the present embodiment has an external resonator structure. Specifically, as shown in FIG. 12, the light source 10 includes a gain medium 11 for generating light, and reflectors 12 and 13 arranged on both sides of the gain medium 11 in an optical path passing through the gain medium 11. The light generated from the gain medium 11 resonates between the reflector 12 and the reflector 13, and is output to each of (i) the optical negative feedback unit 20, (ii) the modulation amount detector unit 50, and (iii) the outside of the laser apparatus. In FIG. 12, the modulation signal generator unit 30, the modulation sensitivity calculator unit 60, the determination unit 70, and the controller unit 80 are omitted and not shown. The gain medium 11 is composed of, for example, a semiconductor optical amplifier, and the reflector 12 and the reflector 13 are composed of, for example, a distributed Bragg reflector.

Further, the light source 10 includes a modulator 14 arranged between the gain medium 11 and the reflector 13. The modulator 14 modulates the frequency of light passing through the modulator 14, according to the modulation signal input from the modulation signal generator unit 30.

In this embodiment in which the light source 10 has an external resonator structure as described above, the same effect as in the first embodiment can be obtained.

Fourth Embodiment

A fourth embodiment will be described. This embodiment is a modification of the configuration of the modulation amount detector unit 50 with respect to the first embodiment. Since the others are the same as those in the first embodiment, only the parts different from the first embodiment will be described.

Figure 13:
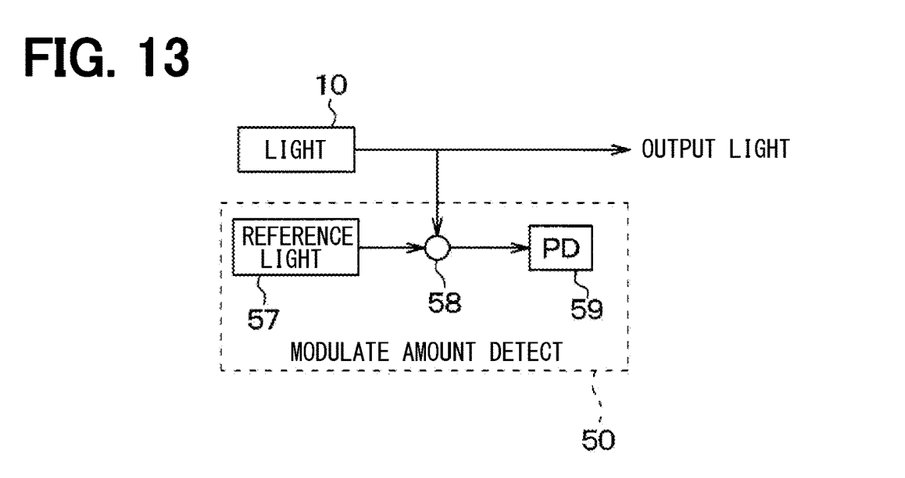
FIG. 13 is a diagram showing a configuration of a modulation amount detector unit according to a fourth embodiment.

As shown in FIG. 13, the modulation amount detector unit 50 of the present embodiment includes a reference light source 57, a combiner 58, and a PD (photodiode) 59. In FIG. 13, the optical negative feedback unit 20, the modulation signal generator unit 30, the adder 40, the modulation sensitivity calculator unit 60, the determination unit 70, and the controller unit 80 are omitted and not shown.

The reference light source 57 outputs a laser light as a reference light for comparison with the output light of the light source 10. The output light of the light source 10 is combined with the reference light output from the reference light source 57 by the combiner 58. Then, the combined light is converted into an electric signal by the PD 59 and input to the modulation sensitivity calculator unit 60.

In the first embodiment, the amount of frequency modulation is detected using a self-delayed heterodyne. However, the output light of the light source 10 and the reference light may be combined in this way, and the modulation amount may be detected from the frequency change in the beat signal generated thereby.

Even in the present embodiment in which the modulation amount detector unit 50 has such a configuration, the same effect as in the first embodiment can be obtained.

Other Embodiments

The present disclosure is not limited to the above-described embodiments and may be appropriately modified.

Figure 14:
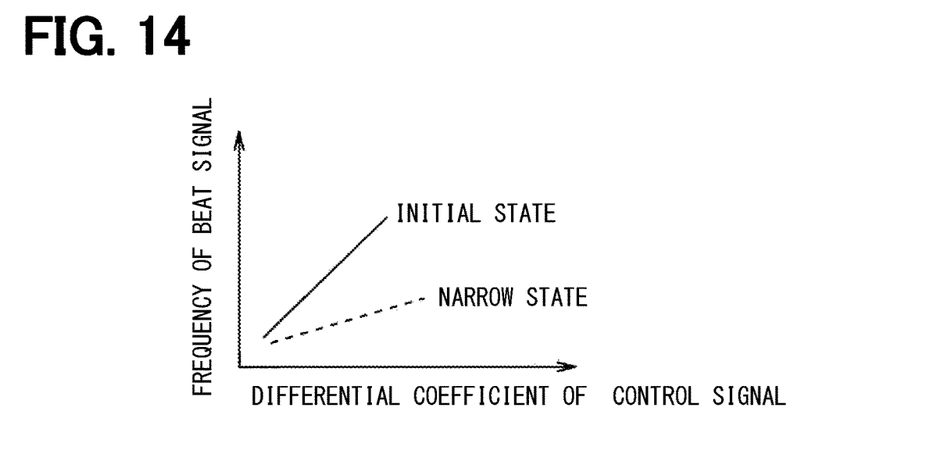
FIG. 14 is a diagram showing a relationship between a differential coefficient of a control signal and a frequency of a beat signal.

For example, in the first embodiment, linear modulation by a PLL circuit is used. However, when linear modulation is not required, the line narrowed state may be determined by directly comparing the response frequency of the beat signal with respect to the control signal without applying feedback. In this case, as shown in FIG. 14, the amount of change in the frequency of the beat signal with respect to the change in the first derivative of the control signal is large in the initial state and small in the line narrowed state. Therefore, the line narrowed state can be determined based on this amount of change.

Further, in the above embodiment, the controller unit 80 controls the optical negative feedback unit 20 based on the determination result of the determination unit 70. However, the laser apparatus may not include the controller unit 80, and only the determination unit 70 may confirm the line narrowed state.

For reference to further explain features of the present disclosure, the description is added as follows.

There are proposed various methods for narrowing the spectral line (i.e., narrowing the spectral line width) of a laser apparatus. For example, in a laser apparatus having an external resonator structure in which a resonator is provided outside the light emitter, a method of narrowing the line by extending the length of the resonator has been proposed. In this method, there is little factor that the line width changes from the design value, so there is not a high need to confirm the line narrowed state. However, if the length of the resonator is extended, it becomes difficult to adjust the oscillation frequency as the line is narrowed, and the frequency modulation range becomes narrow.

In addition, there is proposed a method of narrowing the line by adjusting the frequency of the output light by electric feedback technology and canceling the fluctuation. In this method, since the fluctuation is converted into an electric signal, if it is a low noise circuit, it is possible to detect the degree of the fluctuation on the circuit and confirm the line narrowed state. However, the circuit noise limits the effect of narrowing the line.

On the other hand, in the laser apparatus using optical negative feedback that cancels the fluctuation with light, it is possible to reduce the line width coefficient without extending the length of the resonator; the effect of narrowing the line is greater than that of the laser apparatus using the above method. However, since optical negative feedback operates only by an optical signal, it is difficult to confirm the line narrowed state. For example, if the same configuration as the electrical feedback is used, it is not impossible to electrically obtain a fluctuation signal and confirm the line narrowed state, but the system becomes complicated and it is not realistic. Further, there is proposed a method for confirming the line narrowed state due to the optical negative feedback using a large-scale research measurement system such as an optical fiber of several tens of kilometers or a spectrum analyzer.

However, the method described above is difficult to apply to a small-sized device for general use because the measuring instrument is complicated and large-scale.

It is thus desired to provide a laser apparatus capable of confirming a line narrowed state with a simple configuration.

An aspect of the present disclosure described herein is set forth in the following clauses.

According to an aspect of the present disclosure, a laser apparatus is provided to include: a light source; an optical negative feedback unit; a frequency modulator unit; a modulation amount detector unit; and a modulation sensitivity calculator unit. The light source is configured to generate laser light. The optical negative feedback unit is configured to narrow a spectral line of the laser light using optical negative feedback. The frequency modulator unit is configured to input a modulation signal to the light source to modulate a frequency of the laser light. The modulation amount detector unit is configured to detect a modulation amount in the frequency of the laser light. The modulation sensitivity calculator unit is configured to calculate a modulation sensitivity from (i) the modulation amount and (ii) an intensity of the modulation signal.

In a laser apparatus using optical negative feedback, the modulation sensitivity is inversely proportional to the line narrowing effect. Therefore, by calculating the modulation sensitivity from the amount of modulation and the intensity of the modulation signal, it is possible to confirm the line narrowed state with a simple configuration.

What is claimed is:

1. A laser apparatus comprising:
   a light source configured to generate laser light;
   an optical negative feedback unit configured to narrow a spectral line of the laser light using optical negative feedback;
   a frequency modulator unit configured to input a modulation signal to the light source to modulate a frequency of the laser light;
   a modulation amount detector unit configured to detect a modulation amount in the frequency of the laser light; and
   a modulation sensitivity calculator unit configured to calculate a modulation sensitivity from (i) the modulation amount and (ii) an intensity of the modulation signal.

2. The laser apparatus according to claim 1, wherein:
   the modulation amount detector unit is configured to detect the modulation amount based on a beat signal generated by a self-delayed heterodyne of the laser light; and
   the modulation sensitivity calculator unit is configured to calculate the modulation sensitivity based on the beat signal generated by the self-delayed heterodyne of the laser light.

3. The laser apparatus according to claim 1, wherein:
   the modulation amount detector unit is configured to detect the modulation amount based on an intensity of the light passing through a ring filter.

4. The laser apparatus according to claim 1, wherein:
   the modulation amount detector unit is configured to detect the modulation amount from a change in a frequency of the beat signal generated by a combined wave of the laser light and a reference light.

5. The laser apparatus according to claim 1, further comprising:
   a determination unit configured to determine a state of narrowing the spectral line based on the modulation sensitivity.

6. The laser apparatus according to claim 5, further comprising:
   a controller unit configured to control the optical negative feedback unit based on a determination result by the determination circuit.

7. The laser apparatus according to claim 6, wherein:
   the controller unit is configured to control a coupling phase of the optical negative feedback unit based on a relationship between the modulation amount and the modulation sensitivity.

8. A laser apparatus comprising:
   a light source configured to generate laser light;
   an optical negative feedback circuit configured to narrow a spectral line of the laser light using optical negative feedback;
   a frequency modulator circuit configured to input a modulation signal to the light source to modulate a frequency of the laser light;
   a modulation amount detector circuit configured to detect a modulation amount in the frequency of the laser light; and
   one or more processors configured to calculate a modulation sensitivity from (i) the modulation amount and (ii) an intensity of the modulation signal.

9. The laser apparatus according to claim 8, wherein:
   the modulation amount detector circuit is configured to detect the modulation amount based on a beat signal generated by a self-delayed heterodyne of the laser light; and
   the one or more processors are configured to calculate the modulation sensitivity based on the beat signal generated by the self-delayed heterodyne of the laser light.

10. The laser apparatus according to claim 8, wherein:
    the modulation amount detector circuit is configured to detect the modulation amount based on an intensity of the light passing through a ring filter.

11. The laser apparatus according to claim 8, wherein:
    the modulation amount detector circuit is configured to detect the modulation amount from a change in a frequency of the beat signal generated by a combined wave of the laser light and a reference light.

12. The laser apparatus according to claim 8, wherein:
    the one or more processors are configured to determine a state of narrowing the spectral line based on the modulation sensitivity, providing a determination result.

13. The laser apparatus according to claim 12, wherein:
    the one or more processors are configured to control the optical negative feedback circuit based on the determination result.

14. The laser apparatus according to claim 13, wherein:
    the one or more processors are configured to control a coupling phase of the optical negative feedback circuit based on a relationship between the modulation amount and the modulation sensitivity.

* * * * *